(12) United States Patent
Gentinne et al.

(10) Patent No.: US 6,339,317 B1
(45) Date of Patent: Jan. 15, 2002

(54) REGULATOR FOR SINE WAVE GENERATOR AND SINE WAVE GENERATOR UNIT INCLUDING SUCH A REGULATOR

(75) Inventors: Bernard Gilbert Buy Gentinne, Oudergem; Aarnout Wieers, Hasselt, both of (BE); Pavel Konecny, Brno Reckovice; Ludek Pantucek, Svitavka, both of (CZ)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/714,169

(22) Filed: Nov. 17, 2000

(30) Foreign Application Priority Data

Nov. 19, 1999 (EP) .............................................. 99402881

(51) Int. Cl.[7] .......................... G05F 1/40; H02M 3/335
(52) U.S. Cl. .............................. 323/288; 363/17; 363/40
(58) Field of Search ............................ 363/17, 40, 41, 363/98, 132; 323/288, 285, 286

(56) References Cited

U.S. PATENT DOCUMENTS

| 4,315,219 A | | 2/1982 | Rocheleau et al. ........... 328/14 |
| 5,625,539 A | * | 4/1997 | Nakata et al. ................. 363/17 |
| 5,793,623 A | * | 8/1998 | Kawashima et al. ...... 363/40 X |
| 5,898,340 A | | 4/1999 | Chatterjee et al. .......... 330/251 |

FOREIGN PATENT DOCUMENTS

| CH | 682 019 A5 | 6/1993 |
| DE | 38 31 176 A1 | 9/1988 |

* cited by examiner

Primary Examiner—Jessica Han
(74) Attorney, Agent, or Firm—Sughrue Mion, PLCC

(57) ABSTRACT

Regulator for a sine wave generator unit, including a load feeding power-bridge connected to an output of the sine wave generator. The regulator is inserted between a feedback output of the power-bridge and a reference voltage input of the sine wave generator. The regulator includes regulation means providing a power regulation signal (SET') to the reference voltage input of the sine wave generator from a comparison between a signal (SENSE) at the feedback output of the power bridge and a predetermined set point signal (SETP'). The regulator (4') is a proportional integrating differentiating regulator including start-up and/or shut-off envelope controlling means (19, 20, 21) associated to regulation means (14', 17) for obtaining tightly controlled start-up and/or shut-off slope(s) of the signal at the load feeding output of the power bridge in addition to a tight control of the signal envelope between a start-up slope and the following shut-off slope. In this way the current is regulated on a variable load. (FIG. 3).

13 Claims, 2 Drawing Sheets

REGULATOR FOR SINE WAVE GENERATOR AND SINE WAVE GENERATOR UNIT INCLUDING SUCH A REGULATOR

BACKGROUND OF THE INVENTION

The present invention relates to a regulator for a sine wave generator and more specifically for a generator having to provide a high power and low distortion current sine wave, for instance to an antenna supplying an electromagnetic field in order to have it captured and processed by a transponder. It also relates to a current sine wave generator unit including such a regulator, which is more specifically adapted to provide a high power and low distortion sine wave with a constant AC amplitude on a variable load, this load being the antenna itself in the above mentioned application.

As already known, the slope of the start-up envelope and the slope of the shut-off envelope of a generated sine wave need to be tightly controlled.

According to a known solution, a regulator is associated to the sine wave generator in the sine wave generator unit and a power bridge links the generator to the load in order to provide the required sine wave with a determined power. The output of the power circuit is driven, according to a determined envelope, by means included in and/or associated to the regulator.

For instance, a third order low-pass filter, included in the regulator, is connected to a sensing output of the power bridge, which provides a feedback sense signal in relation with the sine wave provided from the power bridge to the load. A comparator, usually a comparison amplifier, is included in the regulator; it receives separately the sense signal and a set point signal corresponding to the determined envelope. A set signal, obtained at an output of the comparator, is applied to a control input of the sine wave generator as a regulation signal.

However, unacceptable delays are obtainable with this type of regulator including a third order low-pass filter. There is a risk of clamping at the level of the comparison amplifier, if the set signal during for instance start-up phase becomes inappropriately high. In such conditions, the regulation feedback loop of the current sine wave generator unit does not remain as stable as required and it becomes prone to relaxation problems.

SUMMARY OF THE INVENTION

An object of this invention, therefore, is to provide a regulator for a sine wave generator unit, and more specifically to a generator unit providing a high power and low distortion output sine wave, including a load feeding power-bridge connected to an output of a sine wave generator, said regulator being inserted between a feedback output of the power-bridge and a reference voltage input of the sine wave generator, said regulator including regulation means providing a power regulation signal to the reference voltage input of the sine wave generator from a comparison between a signal at the feedback output of the power bridge and a predetermined set point signal.

According to the invention, this regulator is a proportional integrating differentiating regulator including start-up and/or shut-off envelope controlling means associated to regulation means for obtaining a tightly controlled start-up and/or shut-off slope(s) of the signal at the load feeding output of the power bridge in addition to a tight control of the signal envelope between a start-up slope and the following shut-off slope.

In a preferred embodiment, the regulation means includes:

a comparing amplifier which receives the feedback signal from the controlled power bridge and a predetermined set point signal corresponding to a constant voltage for controlling the signal envelope between start-up and shut-off by means of a first current source;

start-up controlling means including a second current source in series with a capacitor which is in parallel with the first current source;

shut-off controlling means including a third current source also in parallel with the first current source for providing a control output signal at the level of a terminal common to the three current sources and to the capacitor.

The invention also extends to a sine wave generator unit and more specifically sine wave generator unit providing a high power and low distortion output sine wave, which includes a load feeding power bridge connected to an output of a sine wave generator and a regulator inserted between a feedback output of the power-bridge and a reference voltage input of the sine wave generator, said regulator including regulation means providing a power regulation signal to the reference voltage input of the sine wave generator from a comparison between a signal at the feedback output of the power bridge and a predetermined set point signal.

According to the invention the sine wave generator unit comprises a proportional integrating differentiating regulator including start-up and/or shut-off envelope controlling means associated to regulation means for obtaining a tightly controlled start-up and/or shut-off slope(s) of the signal at the load feeding output of the power bridge in addition to a tight control of the signal envelope between a start-up slope and the following shut-off slope, as well as a first order band-pass filter for transmitting the feedback signal from the controlled power bridge to the comparing amplifier, with a level similar to the constant level of the predetermined set point signal.

BRIEF DESCRIPTION OF THE DRAWINGS

These and other objects, advantages and features of the invention will become apparent from the following description thereof taken in conjunction with the accompanying drawings, which illustrate a specific embodiment of the present invention.

DETAILED DESCRIPTION OF THE INVENTION

Figure 1:
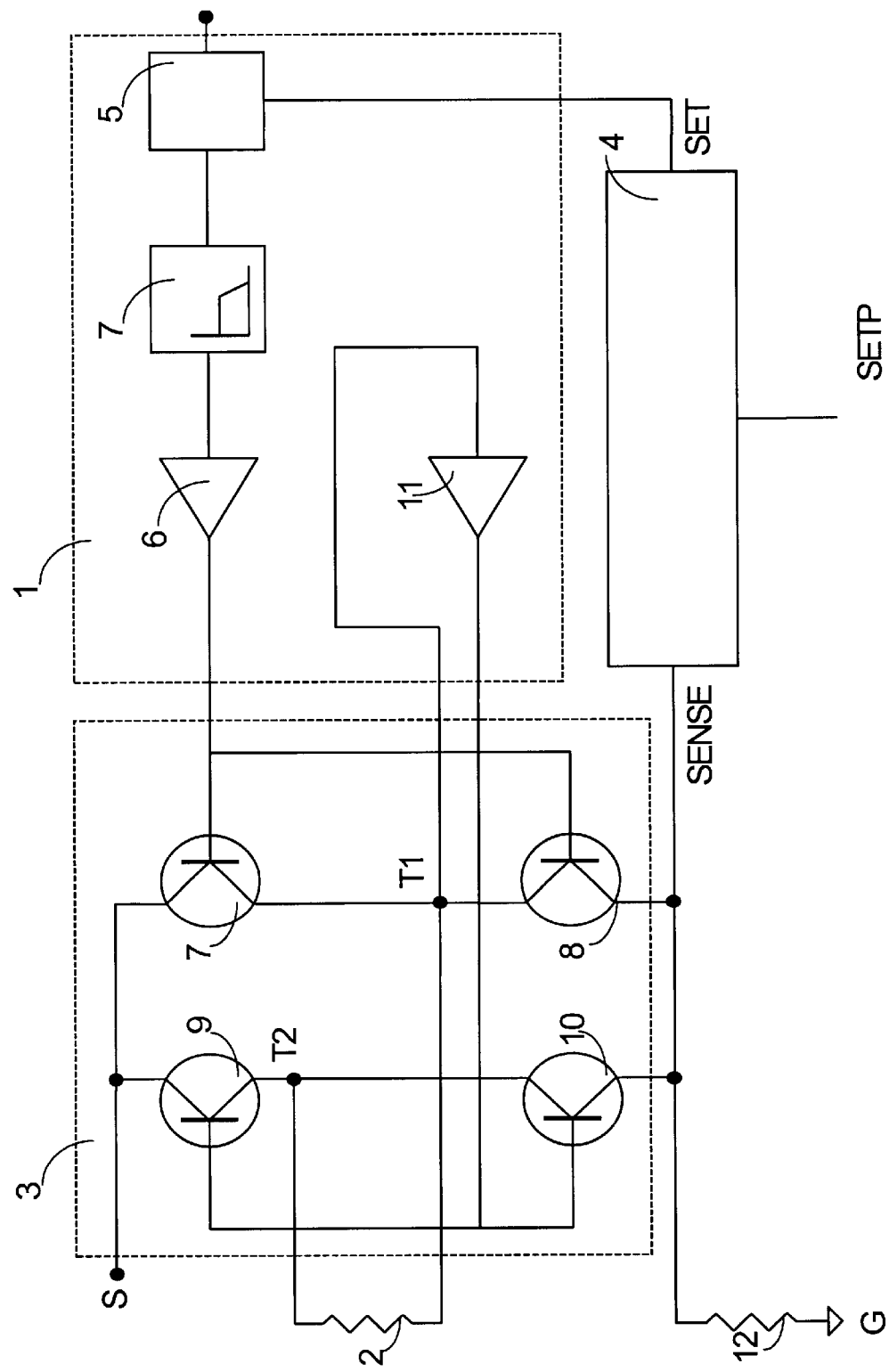
FIGS. 1 and 2 correspond respectively to a current sine wave generator unit and to a regulator for such a unit, according to prior art.

The current sine wave generator unit illustrated on FIG. 1 comprises a sine wave generator 1 coupled to a load 2 by means of a power bridge 3, for instance a H-bridge, in order to feed this load. This load 2 is for instance an antenna producing a strong electromagnetic field which is necessary for the activation of an associated transponder, which is not illustrated here, this transponder capturing the field and having it modulated in an already known way. A high power, low distortion sine wave is applied to the load 2, with values corresponding for instance to a power of 2,5 W rms, a distortion of 30 dB THD and a load varying from 5 to 15 ohms.

Control of the start-up and shut-off envelopes of the output of the antenna constituting load 2 is obtained by means of a regulator 4, which receives a feedback signal SENSE from the power H-bridge 3 and a predetermined set point signal SETP and which provides a power regulation signal SET to sine wave generator 1.

Sine wave generator 1 comprises a digital/analogue converter 5 with digital inputs and a reference voltage input VREF which is controlled by the power regulation signal SET. The output signal of converter 5 is transmitted to an output amplifier 6 by means of a low-pass filter 7 in order to control power H-bridge 3.

As known, this bridge comprises two parallel branches connected on one side to a supply terminal S and to a ground terminal G on the other side. A first of the two branches comprises two input transistors 7, 8 connected in series which are both controlled by the output amplifier 6 and the second branch comprises two output transistors 9, 10 connected in series. Load 2 is connected between two terminals T1 and T2, the terminal T1 being inserted between transistors 7 and 8, the terminal T2 being inserted between transistors 9 and 10. An amplifier 11 is connected to terminal T1 and it controls the transistors 9, 10. A resistor 12 is inserted between the ground terminal G and the common node of the two branches which is directly connected to transistors 8, 10 and it generates a voltage signal SENSE dependent from the output signal provided to load 2. This voltage signal SENSE is the feedback signal which is provided to regulator 4 by power H-bridge 3.

Figure 2:
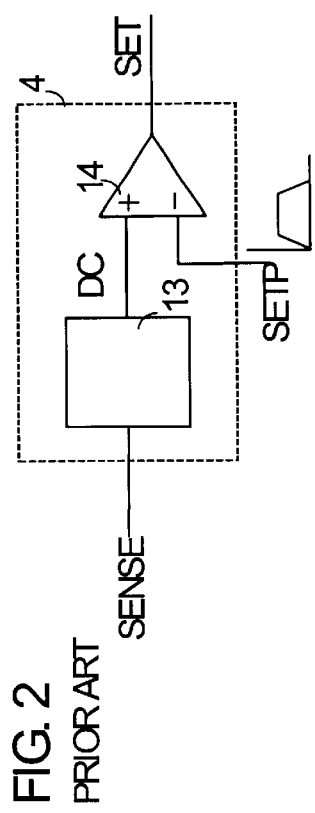

As illustrated on FIG. 2, this SENSE signal is applied by means of a third order low-pass filter 13 to a first input of a comparison amplifier 14. A second input of this amplifier receives the set point signal SETP, which is determined according to the intended regulation and which corresponds, for instance, to the trapezoidal signal shown on FIG. 2, with specifically determined start-up and shut-off slopes. A power regulation signal SET is obtained from the comparison between SENSE and SETP signals by comparison amplifier 14 and it is applied to the voltage reference input VREF of converter 5 in order to control the output signal of this converter.

As indicated above, a proper stability of the regulation feedback loop of a sine wave generator unit including such a regulator is not always obtained and there is a risk of clamping at the level of the comparing amplifier, in relation with the delay introduced during transmission of the signal SENSE to the comparison amplifier 14 by the third order filter 13.

Figure 3:
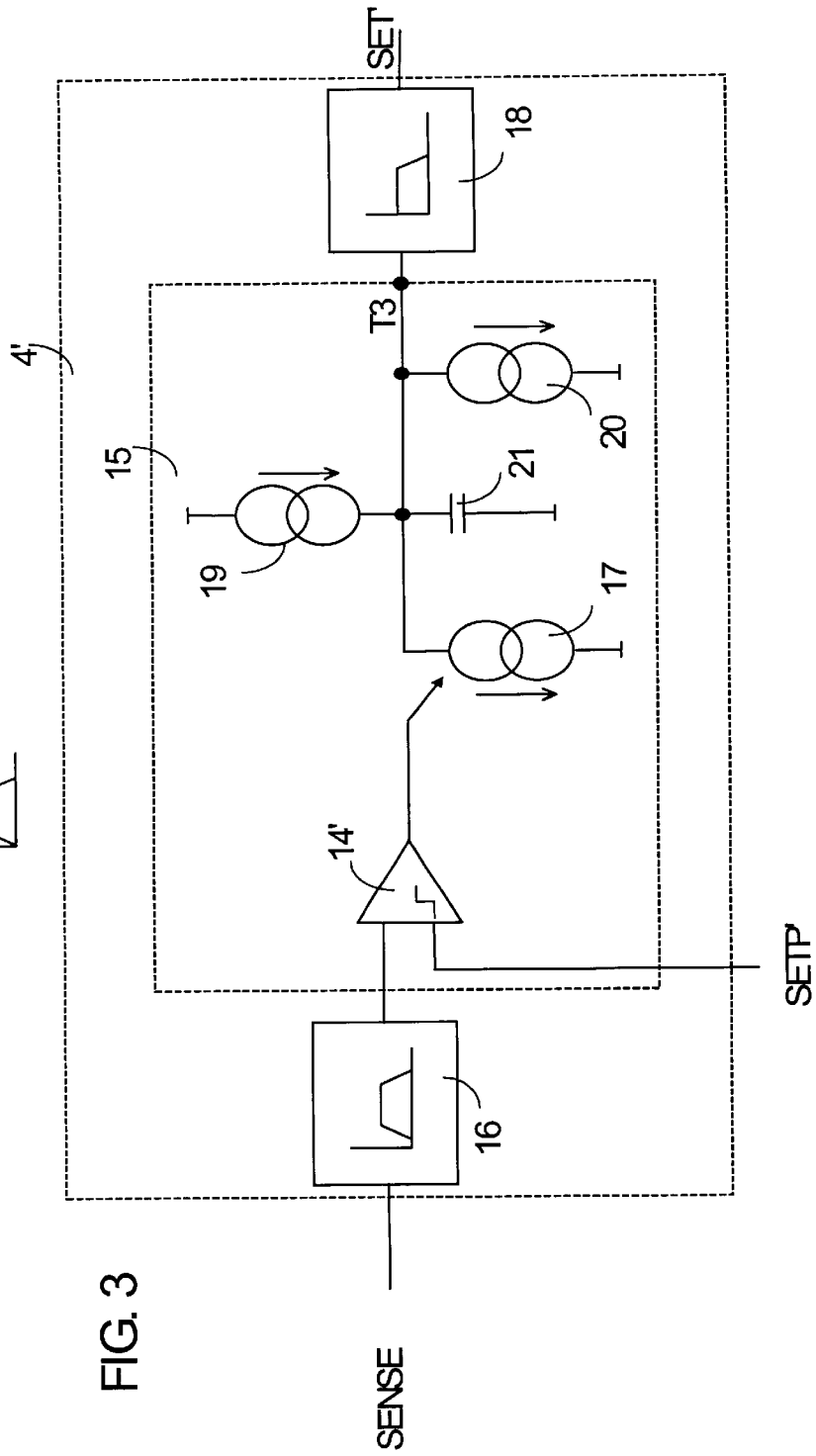
FIG. 3 corresponds to a regulator, for current sine wave generator unit, according to the invention.

According to the invention, a safer regulator is substituted to regulator 4 in a current sine wave generator unit as illustrated in FIG. 1, an example of such a safer regulator, referenced 4', being illustrated on FIG. 3.

Regulator 4' receives the signal SENSE and provides a signal SET' as does regulator 4 but with an increased reaction speed of the regulation feedback loop which is preferably kept inactive during at least one of the critical phases and more particularly during the start-up phase. For this purpose, regulator 4' comprises a proportional integrating differentiating, or PID, regulating circuit 15 for the generation of the envelope corresponding to power regulation signal SET. PID regulating circuit 15 comprises a comparison amplifier 14' receiving a feedback signal SENSE on a first input by means of a first order band-pass filter 16 and a predetermined set point signal SETP'. This set point signal SETP' is different from the SETP signal indicated above, as it corresponds to a constant value step as illustrated above in relation with comparison amplifier 14 inside the corresponding block. Band-pass filter 16 is determined in order to output a signal from SENSE signal with a level similar to the level of the SETP' signal and practically free of any influence from the supply source.

An illustration of the output signal from band-pass filter 16 is illustrated inside the corresponding block on FIG. 3. The signal obtained from the output of comparison amplifier 14' controls a first fraction current source 17, which is connected by a terminal T3 to an input of a low-pass filter 18 in order to provide a signal SET' to an input of a digital/analogue converter which corresponds to converter 5 as illustrated on FIG. 1.

According to the invention, there are also a second current and a third current source 19 and 20 connected by terminal T3 to the input of low-pass filter 18 in order to control the envelope of the signal SET' which is provided for controlling the output level of the digital/analogue converter 5. Second current source 19 is associated with a capacitor 21 in a feeding branch with their common connection terminal T3 connected to the input of low pass-filter 18, for providing a starting-up and a steady-state signal to this filter, during he respective corresponding phases of signal SENSE as transmitted by and-pass filter 16 and as developed below. Third current source 20 is in a drop branch also connected to the input of low-pass filter 18 for providing a shut-off signal to this filter during the corresponding phase of signal SENSE.

During start-up phase, as long as the amplitude of the signal obtained at the output of band-pass filter 16 from the signal SENSE is smaller than the amplitude of the constant set point signal SETP', as predefined, fraction current source 17 is switched inactive and capacitor 21 is progressively loaded by current source 19. This means that current source 19 is at start up unconditionally active. Fraction current source 17 is inactive because the set point is not reached yet. The signal SET', then obtained at the output of low-pass filter 18 increases progressively with a fully predeterminable start-up slope. Accordingly due to the AC feedback loop of the current sine wave generator unit including regulator 4', there is a corresponding increase of signal SENSE. Once in steady state i.e. regulation, current source 19 remains unconditionally active and fraction current source 17 is activated or not, depending on the feedback. So, as soon as the amplitude of the output signal of band-pass filter 16 corresponds to the predetermined amplitude of contact set point signal SETP', fraction current source 17 is switched on and progressively unloads capacitor 21 with a determined unloading factor. Accordingly, the amplitude of signal SET' at the output of low-pass filter 18 becomes smaller and induces a smaller signal SENSE at the input of bandpass filter 16. There is accordingly a tight control obtained at the output of the current sine wave generator unit according to a determined envelope, during start-up and steady-state phases.

Control during shut-off-phase is obtained by means of third current source 20 that is switched on upon request of the user. Current source 19 is consequently switched off. The fraction current source 17 is also switched off by nature since the set-point is never reached any more.

What is claimed is:

1. A regulator for a sine wave generator unit, the sine wave generator unit comprising a load feeding power bridge connected to an output of a sine wave generator, said regulator being inserted between a feedback output of the power bridge and a reference voltage input of the sine wave generator, said regulator comprising regulation means providing a power regulation signal to the reference voltage input of the sine wave generator from a comparison between a signal at the feedback output of the power bridge and a predetermined set point signal, wherein said regulation means comprise a proportional integrating differentiating regulator comprising start-up and shut-off envelope controlling means for obtaining a controlled start-up and shut-off slopes of the signal at the load feeding output of the power bridge in addition to a control of a signal envelope between a start-up slope and the following shut-off slope.

2. The regulator according to claim 1, wherein:
said regulation means further comprises:
a comparing amplifier that receives the feedback signal from the power bridge and a predetermined set point signal and outputs a voltage for controlling the signal envelope between start-up and shut-off; and
a first current source coupled to an output of said comparing amplifier;
said start-up controlling means comprises a second current source in series with a capacitor which is coupled in parallel with said first current source;
and said shut-off controlling means comprises a third current source coupled in parallel with said first current source.

3. The regulator according to claim 1, further comprising a first order band-pass filter for transmitting the feedback signal from the power bridge to said regulation means.

4. The regulator according to claim 3, wherein said regulations means comprises a comparing amplifier that outputs a signal having a level substantially similar to the constant level of the predetermined set point signal.

5. The regulator according to claim 4, wherein said regulation means further comprises a first current source.

6. The regulator according to claim 1, further comprising a low-pass filter that provides the output signal of said proportional integrating differentiating regulator to the reference voltage input of the sine wave generator.

7. A sine wave generator unit which includes a load feeding power bridge connected to an output of a sine wave generator and a regulator inserted between a feedback output of the power bridge and a reference voltage input of the sine wave generator, said regulator including regulation means providing a power regulation signal to the reference voltage input of the sine wave generator from a comparison between a feedback signal at the feedback output of the power bridge and a predetermined set point signal, wherein said regulator further comprises a proportional integrating differentiating regulator including start-up and shut-off envelope controlling means associated to regulation means for obtaining a tightly controlled start-up and shut-off slopes of the signal at the load feeding output of the power bridge in addition to a tight control of the signal envelope between a start-up slope and the following shut-off slope, and said regulator further comprises a first order band-pass filter for transmitting the feedback signal from the power bridge to a comparing amplifier, with a level similar to the constant level of the predetermined set point signal.

8. The sine wave generator unit according to claim 7, herein:
said regulation means comprises a first current source coupled to an output of said comparing amplifier;
said start-up envelope controlling means comprises a second current source in series with a capacitor which is coupled in parallel with said first current source; and
said shut-off envelope controlling means comprises a third current source coupled in parallel with said first current source.

9. A sine wave generator unit comprising:
a sine wave generator;
a load feeding power bridge coupled to an output of the sine wave generator;
a regulator coupled between a feedback output of the power bridge and a reference voltage input of the sine wave generator, said regulator providing a power regulation signal to the reference voltage input of the sine wave generator from a comparison between a signal at the feedback output of the power bridge and a predetermined set point signal, said regulator further comprising:
a band-pass filter that transmits the feedback signal from the power bridge;
a proportional integrating differentiating regulator comprising:
a regulation device coupled to an output of the band-pass filter,
a start-up envelope controlling device coupled to an output of the regulation device, and
a shut-off envelope controlling device coupled to the output of the regulation device; and
a low-pass filter coupled to an output of the proportional integrating differentiating regulator, and the output of the low-pass filter is coupled to the reference voltage input of the sine wave generator.

10. The sine wave generator unit according to claim 9, wherein said band-pass filter is a first order band-pass filter.

11. The sine wave generator unit according to claim 9, wherein said regulation device comprises a comparing amplifier that receives the feedback signal from the power bridge and a predetermined set point signal and a first current source coupled to an output of said comparing amplifier.

12. The sine wave generator unit according to claim 11, wherein said start-up controlling device comprises a second current source in series with a capacitor which is coupled in parallel with said first current source.

13. The sine wave generator unit according to claim 12, wherein said shut-off controlling device comprises a third current source coupled in parallel with said first current source.

* * * * *